(12) United States Patent
O'Connell

(10) Patent No.: US 9,396,815 B2
(45) Date of Patent: Jul. 19, 2016

(54) MEMORY STRUCTURE

(71) Applicant: TAIWAN SEMICONDUCTOR MANUFACTURING COMPANY, LTD., Hsinchu (TW)

(72) Inventor: Cormac Michael O'Connell, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/271,933

(22) Filed: May 7, 2014

(65) Prior Publication Data

US 2014/0241086 A1   Aug. 28, 2014

Related U.S. Application Data

(60) Division of application No. 13/399,993, filed on Feb. 17, 2012, now Pat. No. 8,750,059, which is a continuation-in-part of application No. 12/849,157, filed on Aug. 3, 2010, now abandoned.

(60) Provisional application No. 61/233,387, filed on Aug. 12, 2009.

(51) Int. Cl.
| | | |
|---|---|---|
| *G11C 7/00* | (2006.01) | |
| *G11C 29/00* | (2006.01) | |
| *G11C 29/44* | (2006.01) | |
| *G06F 11/10* | (2006.01) | |

(52) U.S. Cl.
CPC ............ *G11C 29/00* (2013.01); *G06F 11/1048* (2013.01); *G11C 29/4401* (2013.01); *G11C 29/808* (2013.01)

(58) Field of Classification Search
CPC ...... G11C 29/24; G11C 29/835; G11C 29/781
USPC .................................................. 365/201, 200
See application file for complete search history.

(56) References Cited

U.S. PATENT DOCUMENTS

| | | | |
|---|---|---|---|
| 5,263,032 | A | 11/1993 | Porter et al. |
| 5,469,388 | A | 11/1995 | Park |
| 5,511,164 | A | 4/1996 | Brunnmeier et al. |
| 5,701,270 | A | 12/1997 | Mohan Rao |
| 6,553,510 | B1 | 4/2003 | Pekny |
| 6,560,725 | B1 | 5/2003 | Longwell et al. |
| 7,168,010 | B2 | 1/2007 | Yadavalli et al. |
| 7,984,329 | B2 | 7/2011 | Lastras-Montano et al. |
| 2002/0188897 | A1 | 12/2002 | Ruckerbauer et al. |
| 2005/0044459 | A1 | 2/2005 | Scheuerlein et al. |
| 2006/0018159 | A1* | 1/2006 | Picca ............... G11C 29/82 365/185.17 |
| 2006/0168494 | A1* | 7/2006 | Trainin .......................... 714/758 |
| 2008/0282024 | A1* | 11/2008 | Biswas et al. .................. 711/103 |
| 2009/0285043 | A1 | 11/2009 | Nasu et al. |
| 2013/0301369 | A1 | 11/2013 | Shvydun et al. |

* cited by examiner

*Primary Examiner* — Han Yang
(74) *Attorney, Agent, or Firm* — Hauptman Ham, LLP

(57) ABSTRACT

A memory structure includes a memory row of a memory array, a plurality of first bits, a first redundancy row, and a plurality of second bits. The memory row includes a plurality of memory words. The plurality of first bits is configured to indicate whether an individual memory word of the plurality of memory words of the memory row has an error. The first redundancy row includes a plurality of first redundancy words. The plurality of second bits is configured to indicate whether an individual first redundancy word of the plurality of first redundancy words of the first redundancy row has an error.

20 Claims, 12 Drawing Sheets

MEMORY STRUCTURE

PRIORITY CLAIM

The present application is a divisional of U.S. application Ser. No. 13/399,993, filed Feb. 17, 2012, which is a Continuation-in-Part of U.S. application Ser. No. 12/849,157, filed Aug. 3, 2010, which in turn claims the priority of U.S. Provisional Application No. 61/233,387, which are each incorporated herein by reference in their entireties.

FIELD

The present disclosure is related to a memory with self-repairing capabilities.

BACKGROUND

In some existing approaches related to an embedded dynamic random access memory (eDRAM), when a failure occurs at a memory location of the eDRAM, a human being, such as a system engineer, needs to go through some processes to have the error repaired.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
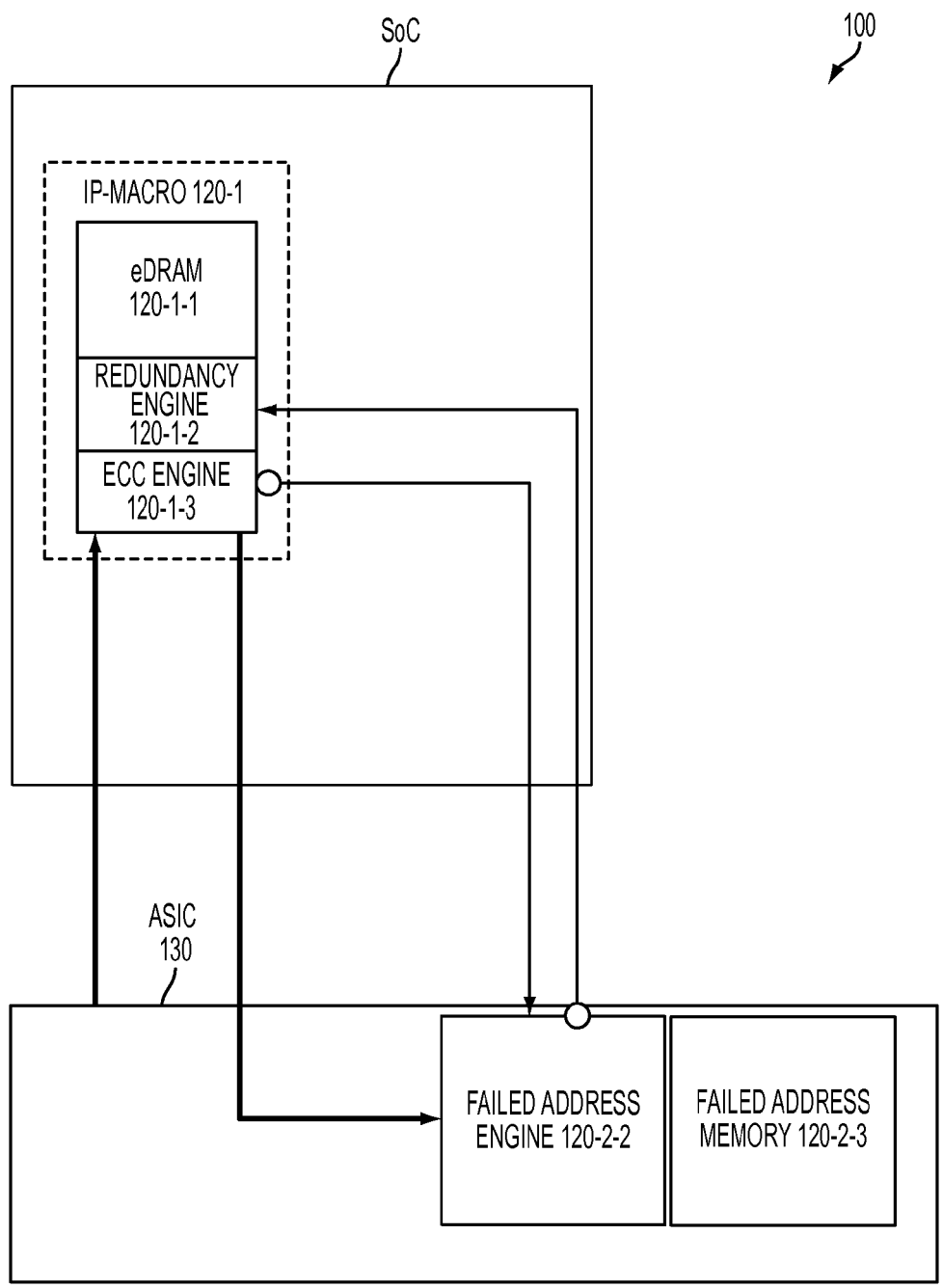
FIG. 1 is a block diagram of a system using an embedded dynamic random access memory (eDRAM), in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a memory self-repair completes within one no-operation (NOP) instruction cycle. No external memory is used during the self-repair process. In some embodiments, the system does not track the failed address, nor provide the corrected data. In some embodiments, the self-repair is performed during the system execution of a NOP instruction. As a result, no extra instruction is used by the memory self-repair.

U.S. patent application Ser. No. 12/849,157, entitled MEMORY ERRORS AND REDUNDANCY and filed Aug. 3, 2010, is hereby incorporated by reference in its entirety.

Exemplary System

In this document, a low logical value is labeled in the drawings as "0" while a high logical value is labeled as "1."

FIG. 1 is a block diagram of a system 100, in accordance with some embodiments. System 100 includes a system-on-chip (SoC) 120, an application specific integrated circuit (ASIC 130) external to SoC 120, and other circuitry including software, which, for simplicity, is not shown. In some embodiments, system 100 functions as a network router or a network switch. Depending on implementation, system 100 may be responsible for repairing an error or delegate such repair to other entities such as SoC 120, ASIC 130, etc. Further, system 100 may repair an error when the error is first identified or schedule the error to be repaired at another time. Repairing an error includes overwriting the data with the data provided by an error correcting code (ECC) engine 120-1-3 or flipping the logic value of the existing data in the failed location.

SoC 120 represents a subsystem using an embedded dynamic random access memory (eDRAM) 120-1-1 that may have errors to be repaired. Generally, SoC 120 includes a complex electronic or computing system having sub systems integrated into a chip. Exemplary components of SoC 120 include a central processing unit (CPU), a data storage unit, an input-output (IO) controller, digital and/or analog circuitry, all of which, for simplicity, are not shown. In some embodiments, SoC 120 includes a network package buffer, which stores data, processes data packets, and provides the processed data packets. The term system or subsystem in this document includes, for example, a computing unit having processing and/or computing intelligent capabilities.

An IP-macro 120-1 includes a functional block, a subsystem, etc. In the embodiments of FIG. 1, because IP-macro 120-1 includes eDRAM 120-1-1, which is a memory unit, IP-macro 120-1 is called a memory subsystem.

eDRAM 120-1-1 includes a plurality of banks of memory cells. Each bank includes a number of rows, a number of columns and related circuitry such as sense amplifiers, word lines, bit lines, etc. Depending on applications, the size of eDRAM 120-1-1 varies, including, for example, 1, 2, 4 Mb, etc. A row of memory cells may be called a data word. Various embodiments of the disclosure provide mechanisms for the errors which occurred in eDRAM 120-1-1 to be self-repaired without intervention by a human being. Examples of errors include soft errors, latent errors, variable retention time (VRT) errors, etc. eDRAM 120-1-1 is a type of memory used for illustration, other storage devices including, for example, SRAM, flash, one time program (OTP), multi time program (MTP), etc., are within the scope of various embodiments.

A redundancy engine 120-1-2 is responsible for comparing addresses accessing eDRAM 120-1-1 with known faulty locations in eDRAM 120-1-1, in order to redirect those accesses to redundant or spare locations assigned to replace the known faulty locations. In some embodiments, at a final test in production, redundant locations are programmed into eDRAM 120-1-1. In various embodiments, a number of spare locations are reserved for a replacement that might be needed when a latent or a VRT error is discovered during operation.

In various embodiments, redundancy engine 120-1-2 stores the address of the faulty locations. When an error occurs during operation, for example, redundancy engine 120-1-2, based on the information provided by a failed address engine 120-2-2, recognizes the faulty location, controls and identifies a corresponding redundancy location used to repair that faulty location. Once the faulty location has been repaired, redundancy engine 120-1-2 redirects the next access to the faulty location to the corresponding redundancy location.

Depending on applications, an error in eDRAM 120-1-1 can be repaired in different ways. For example, if the data is stored in eDRAM 120-1-1 and may be accessed multiple times for read, redundancy engine 120-1-2 schedules the repair of an identified error. But if the data is likely to be over written by an application using system 100 before the next read, then redundancy engine 120-1-1 does not schedule the repair. In different embodiments, the repair is scheduled through ECC engine 120-1-3, SoC 120, or system 100.

ECC engine 120-1-3 encodes inbound data for storage and decodes and corrects outbound data when communicating with other circuitry such as eDRAM 120-1-1, ASIC 130, etc. ECC engine 120-1-3 recognizes the inbound data and adds parity bits to the data. When eDRAM 120-1-1 is accessed, the data and associated parity bits are sent to ECC engine 120-1-3, based on which ECC engine 120-1-3 determines if an error is present. In some embodiments, when an error occurs in eDRAM 120-1-1, ECC engine 120-1-3, based on the inbound data and associated parity bits, recognizes an error, identifies the address of a failed bit, and flags the error. In some embodiments, ECC engine 120-1-3 uses six parity bits to correct a single error in a data word of 32 bits and uses seven parity bits to correct a single error and detect a double error. In various embodiments, ECC engine 120-1-3 can be defined by the SoC designer, and is therefore suitable for use with different data width of a design choice. In some embodiments, ECC engine 120-1-3 is a type of ECC engine known in the art. Other ECC engines are within the scope of various embodiments.

ASIC 130 includes a specific application design, which, in some embodiments, includes a network processing unit (NPU). ASIC 130 may be considered the intelligence of system 100. In various embodiments, ASIC 130 monitors the ECC flag, and recognizes whether data is correct or contains an error. If the flag is detected such as when an error has been identified, ASIC 130 stores the address of the faulty memory location. ASIC 110, when recognizing the data contains an error, identifies the address and sends the address to failed address engine 120-2-2. Depending on implementations, ASIC 130 delays the repair so that system 100 may repair the error at a later time. Depending on applications, SoC 120 may perform the repair functions.

Failed address engine 120-2-2 determines the type of failures and the action to be taken based on a history of failure, such as a list of stored failed addresses. Because soft errors occur randomly, soft errors are unlikely to repeat in the same location multiple times. In some embodiments, the first time an error occurs in a location, failed address engine 120-2-2 considers the error as a soft error. If the error, however, occurs more than once in the same location, such as a second time, a third time, etc., failed address engine 120-2-2 considers the error as a latent error or a VRT error. For illustration, latent or VRT errors are called "hard errors." In various embodiments, failed address engine 120-2-2 stores the list of failed addresses. When an error occurs, failed address engine 120-2-2 compares the failed address to the stored list of failed addresses. If there is not a match, failed address engine 120-2 considers the error to be a soft error. If, however, there is a match, failed address engine 120-2-2 considers the error to be a hard error. Failed address engine 120-2-2, based on information provided by ECC engine 120-1-3, calculates the correct data for a faulty location and provides that data to redundancy engine 120-1-2. When appropriate, failed address engine 120-2-2 sends a request to repair the failed address to redundancy engine 120-1-2, which can repair the failed address on the fly using spare redundancy. Depending on implementations, various embodiments use a content-addressable memory (CAM) to implement failed address engine 120-2-2. In some embodiments, failed address engine 120-2-2 also includes a self-repair logic illustratively shown as self-repair engine 440 in FIG. 3.

Memory Chip

Figure 2:
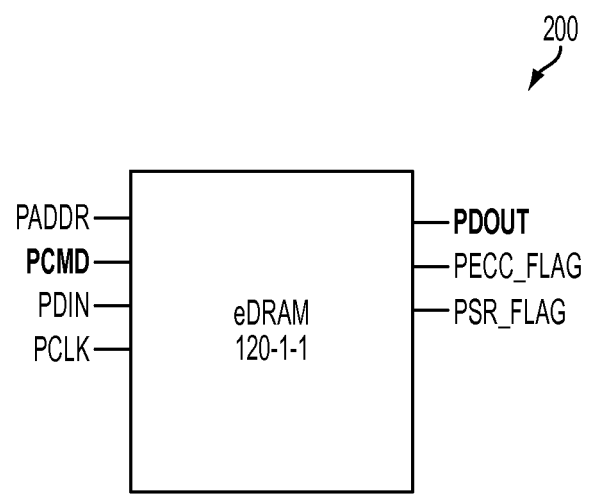
FIG. 2 is a block diagram of a semiconductor chip embodying the eDRAM in FIG. 1, in accordance with some embodiments.

FIG. 2 is a block diagram of a semiconductor chip 200 embodying eDRAM 120-1-1, in accordance with some embodiments. Pins PADDR, PCMD, PDIN, PCLK, PDOUT, PSR_FLAG, and PECC_FLAG are used for eDRAM 120-1-1 to interface with circuits outside of eDRAM 120-1-1. For illustration, signals received at pints PADDR, PCMD, PDIN, PCLK, PDOUT, PSR_FLAG and PECC_FLAG are called ADDR, CMD, DIN, CLK, DOUT, SR_FLAG, and ECC_FLAG, respectively. For simplicity, signals ADDR, CMD, DIN, CLK, DOUT, SR_FLAG, and ECC_FLAG are not shown in FIG. 2.

A command signal CMD is for use in a read, a write, and a refresh operation. A clock signal CLK represents a system clock signal. Signal ADDR represents the address of the memory cell in eDRAM 120-1-1 to be accessed. Accessing eDRAM 120-1-1 refers to writing to or reading from eDRAM 120-1-1. Signal DIN represents the data to be written to the accessed memory cell. Signal DOUT represents the data read from the accessed memory cell. Signal ECC_FLAG indicates an error in the data being read out of the accessed memory cell has been detected and fixed. In some embodiments, ECC engine 121-1-3 sets signal ECC_FLAG to a high logical value when an error is identified by ECC engine 121-1-3. A self-repair signal SR_FLAG indicates that an NOP instruction is desired to repair the error. In a non-cached architecture, the NOP instruction is provided in the next clock cycle. In a cached architecture, however, the NOP instruction can be delayed.

In some embodiments, when eDRAM 120-1-1 operates in a mission mode in which eDRAM 120-1-1 is used in a system to store data and provide the stored data to other circuits, the self-repair occurs in one clock cycle. For example, the command signal CMD receives the NOP operation, self-repair signal SR_FLAG has a logical high value, and, on the next rising edge of clock signal CLK, eDRAM 120-1-1 self-repairs a hard error that occurred in a memory word, using the address from the flagged address and the data corrected from ECC engine 120-1-3. In some embodiments, the NOP operation is an operation in which there is no conflicting operation to the memory areas in question.

Error-Tag Memory Structure

Figure 3:
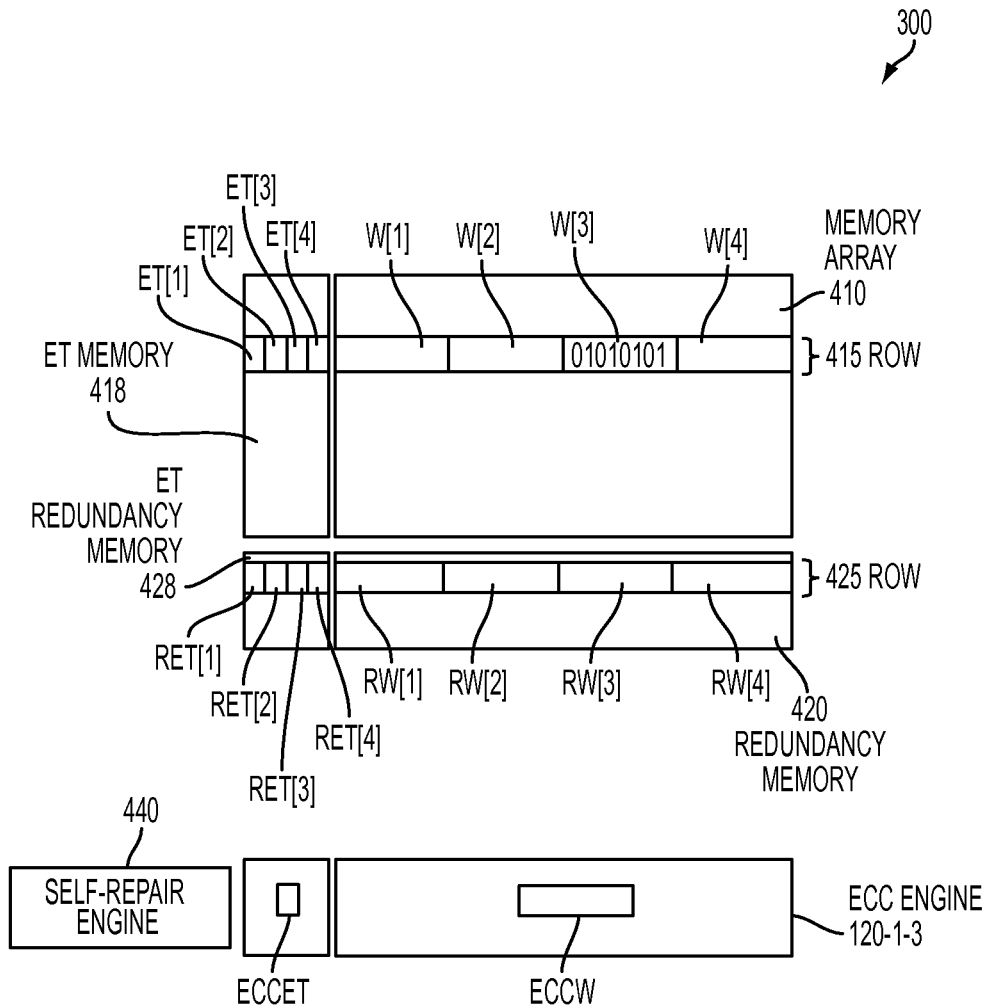
FIG. 3 is a diagram of a memory structure that includes various hardware blocks related to self-repair of erroneous memory locations of the eDRAM in FIG. 1, in accordance with some embodiments.

FIG. 3 is a diagram of a structure 300 that includes various hardware blocks related to self-repair of eDRAM 120-1-1, in accordance with some embodiments. In some embodiments, a memory array 410, an error-tag (ET) memory 418, a redundancy memory 420, and an ET redundancy memory 428 are part of eDRAM 120-1-1. Different locations of memory array 410, ET memory 418, redundancy memory 420, and ET redundancy memory 428 are within the scope of various embodiments.

Memory array 410 includes a plurality of memory cells arranged in rows and columns. For illustration, one row 415 of memory cells is shown. A row of memory cells includes a plurality of memory words W. For illustration, row 415 is shown having four words labeled words W[1], W[2], W[3], and W[4]. Common numbers of words W in a row include 8, 16, 32, 64, etc. A different number of words W in a row of memory cells is within the scope of various embodiments. Each word W includes a plurality of memory cells or memory bits. For illustration, a word W including eight bits B1, B2, B3, B4, B5, B6, B7, and B8 is depicted in word W[3], and is labeled in FIG. 4. The exemplary binary value 01010101 corresponding to eight bits in word W[3] is shown in FIG. 3 for illustration. For simplicity, memory bits in words W[1], W[2], and W[4] are not shown. In some embodiments, when a memory location or a bit in a word W has an error, the error is corrected before the next access of that bit or word W. Correcting the data includes intentionally writing the corrected data to the erroneous location and/or having a program application that uses eDRAM 120-1-1 write the data of the application to the erroneous location. After correcting the data any further error at the same location is assumed to be due to a hard error.

Error-tag (ET) memory 418 includes ET bits corresponding to words W in memory array 410. For example, row 415 includes four words W[1], W[2], W[3], and W[4]. Accordingly, in some embodiments, ET memory 418 includes four bits ET[1], ET[2], ET[3], and ET[4] corresponding to four words W[1], W[2], W[3], and W[4], respectively. When the number of words W in a row of memory changes, the number of bits ET changes accordingly. For example, if N represents an integer, and if there are N number of words W[1] to W[N], there are N number of bits ET[1] to ET[N].

In some embodiments, each bit ET is default to a logical low value indicating there is no error in any of the corresponding word W. When a memory cell in a word W has an error, the corresponding ET bit is set to a high logical value. For example, if a memory cell in word W[1] has an error, bit ET[1] is set to a logical high value. If a memory cell in word W[2] has an error, bit ET[2] is set to a logical high value, and if a memory cell in word W[3] has an error, bit ET[3] is set to a logical high value, etc. Other values in bits ET indicating the erroneous states of the corresponding words W are within the scope of various embodiments. In some embodiments, failed address engine 120-2-2 changes the values in bits ET.

In FIG. 3, bits ET are shown separated from the corresponding words W, in accordance with some embodiments. Bits ET at other locations are within the scope of various embodiments. For example, one bit ET is embedded in a corresponding word W. Further, in FIG. 3, four bits ET corresponding to four words W by the indexes 1, 2, 3, 4 of the bits ET and of the corresponding words W are illustratively shown. Different ways of associating bits ET to words W are within the scope of various embodiments. For example, two additional binary bits providing four binary combinations are used to correspond or associate four bits ET[1] to ET[4] with four words W[1] to W[4]. Three additional binary bits providing eight binary combinations are used to associate eight bits ET[1] to ET[8] with eight words W[1] to W[8], and four additional binary bits providing sixteen binary combinations are used to associate sixteen bits ET[1] to ET[16] with sixteen words W[1] to W[16], etc.

Redundancy memory 420 includes memory cells used to repair erroneous memory cells. Redundancy memory 420 is commonly called row redundancy memory 420. Similar to memory array 410, redundancy memory 420 includes a plurality of memory cells arranged in rows and columns. For illustration, only one row 425 of redundancy memory 420 is shown. The number of words in a row of redundancy memory 420 corresponds to the number of words in a row of memory array 410. For example, row 425 is shown having four words RW[1], RW[2], RW[3], and RW[4] corresponding to four words W[1], W[2], W[3], and W[4] of memory array 410, respectively. When the number of words W in a row of memory array 410 changes, the number of words RW in a row of redundancy memory 420 changes accordingly. The number of redundancy rows in redundancy memory 420 varies depending on applications and design choices, taking account of various factors including, for example, the expected life time of eDRAM 121-1-1, the estimated number of failures in the life time, etc.

In some embodiments, when a memory cell in memory array 410 has a hard error, a row in redundancy memory 420 is used in place of the row in memory array 410 that contains the erroneous memory cell. For example, when a memory cell has an error and is accessed, failed address engine 120-2-2 redirects accessing of the erroneous memory row in memory array 410 to a corresponding row in redundancy memory 420. For another example, row 415 includes an erroneous memory cell. When the erroneous memory cell in row 415 is accessed, failed address engine 120-2-2 redirects accessing to a corresponding memory cell in row 425. Further, when a memory cell in a row of redundancy memory 420 has a hard error, another row in redundancy memory 420 is used in place of the row of redundancy memory 420 that contains the erroneous memory cell. Self-repairing a redundancy row in redundancy memory 420 is similar to self-repairing a row in memory array 410. In some embodiments, a "full" signal through a pin of eDRAM 120-1-1 in FIG. 2 is implemented to indicate that all redundancy rows in redundancy memory 420 have been used, and no additional hard errors can be recovered. In other words, the full signal indicates that eDRAM 120-1-1 has made all the repairs of which eDRAM 120-1-1 is capable. In some embodiments, a number of flags SR_FLAG issued by ECC engine 120-1-3 is counted, and the full signal is activated when the number of flags SR_FLAG reaches the maximum number of rows allocated in redundancy memory 420. Using a redundancy row in place of an erroneous row having an erroneous bit is for illustration. Using a redundancy word in place of an erroneous word is within the scope of various embodiments. For example, word W[3] has an error. When word W[3] is accessed, failed address engine 120-2-2 redirects accessing to the corresponding redundancy word RW[3].

Error-tag (ET) redundancy memory 428 includes bits RET corresponding to memory words RW in row redundancy memory 420. As illustratively shown in FIG. 3, a row 425 includes four words RW[1], RW[2], RW[3], and RW[4]. In some embodiments, ET redundancy memory 428 includes four bits RET[1], RET[2], RET[3], and RET[4] corresponding to four words RW[1], RW[2], RW[3], and RW[4], respectively. When the number of words RW in a row changes, the number of bits RET changes accordingly. In FIG. 3, bits RET are shown separated from the corresponding words RW, in accordance with some embodiments. Bits RET at other locations are within the scope of various embodiments. For example, each bit RET is embedded in a corresponding word RW. Further, in FIG. 3, four bits RET corresponding to four words RW are shown for illustration. Different ways of associating bits RET to words RW are within the scope of various embodiments. For example, two additional binary bits providing four binary combinations are used to associate four bits RET[1] to ET[4] with four words W[1] to W[4]. Three additional binary bits providing eight binary combinations are used to associate eight bits RET[1] to RET[8] with eight words RW[1] to RW[8], and four additional binary bits providing sixteen binary combinations are used to associate sixteen bits RET[1] to RET[16] with sixteen words RW[1] to RW[16], etc.

In some embodiments, each bit RET is default to a logical low value indicating there is no error in any of the corresponding word RW. When a memory cell in a word RW has an error, the corresponding bit RET is set to a logical high value. For example, if a memory cell in word RW[1] has an error, bit RET[1] is set to a logical high value. If a memory cell in word RW[2] has an error, bit RET[2] is set to a logical high value, and if a memory cell in word RW[3] has an error, bit RET[3] is set to a logical high value, etc. Other values in bits RET indicating the erroneous states of the corresponding words RW are within the scope of various embodiments. In some embodiments, failed address engine 120-2-2 changes the values in bits RET. In some embodiments, when redundancy memory 420 is part of memory array 410, bits RET are parts of ET memory 418.

ECC engine 120-1-3 includes a word logic engine ECCW and an error-tag logic engine ECCET. Word logic engine ECCW is used to process a word W, such as, a word W[1], W[2], W[3], or W[4]. For example, when a word W is accessed, the binary value of word W and parity bits are provided to word logic engine ECCW, which, in some embodiments, based on Hamming code technique, identifies a bit in word W that has flipped. Engine ECCW also flips the erroneous bit to provide the corrected data for the erroneous word W. Effectively, engine ECCW determines whether an error has occurred in word W, and if the error occurs, engine ECCW provides the corrected data. For simplicity, in the below illustrations, when the binary data of a word W is provided to engine ECCW to be processed, the parity bits for the Hamming code decoding techniques are not shown. Hamming ECC code technique is used for illustration. Other ECC techniques are within the scope of various embodiments.

Error-tag logic engine ECCET is used to process each bit ET, such as each of four bits ET[1] to ET[4]. In some embodiments, engine ECCET is a comparator providing a result to indicate whether the accessed bit ET is logically high or logically low. For example, if the accessed bit ET has a high logical value, engine ECCET provides a result having a logical high value. Effectively, engine ECCET indicates that the word W corresponding to the bit ET has had an error previously. In contrast, if the accessed bit ET has a low logical value, engine ECCT provides the result having a logical low value. Effectively, engine ECCET indicates that the word W corresponding to the accessed bit ET had no previous error. For another example, the high logical value from engine ECCET and a logical high value of ECC_FLAG indicate that the error in the word W corresponding to the accessed bit ET is a hard error. In the embodiments in which bits ET are co-located with their respective words W, engine ECCET is part of engine ECCW. Effectively, ECC engine 120-1-3 decodes and detects error before evaluating corresponding bits ET.

In some embodiments, when a hard error occurs, self-repair engine 440 is configured to repair the data. In various embodiments, self-repair engine 440 is part of failed address engine 120-2-2. Embodiments of the disclosure, however, are not limited by the location of self-repair engine 440.

Self-Repair Illustration

FIGS. 4-12 are diagrams illustrating structure 300 in various stages related to self-repairing an error in eDRAM 120-1-1, in accordance with some embodiments. For simplicity, various elements in FIG. 3 are not labeled in FIGS. 4-12.

Figure 4:
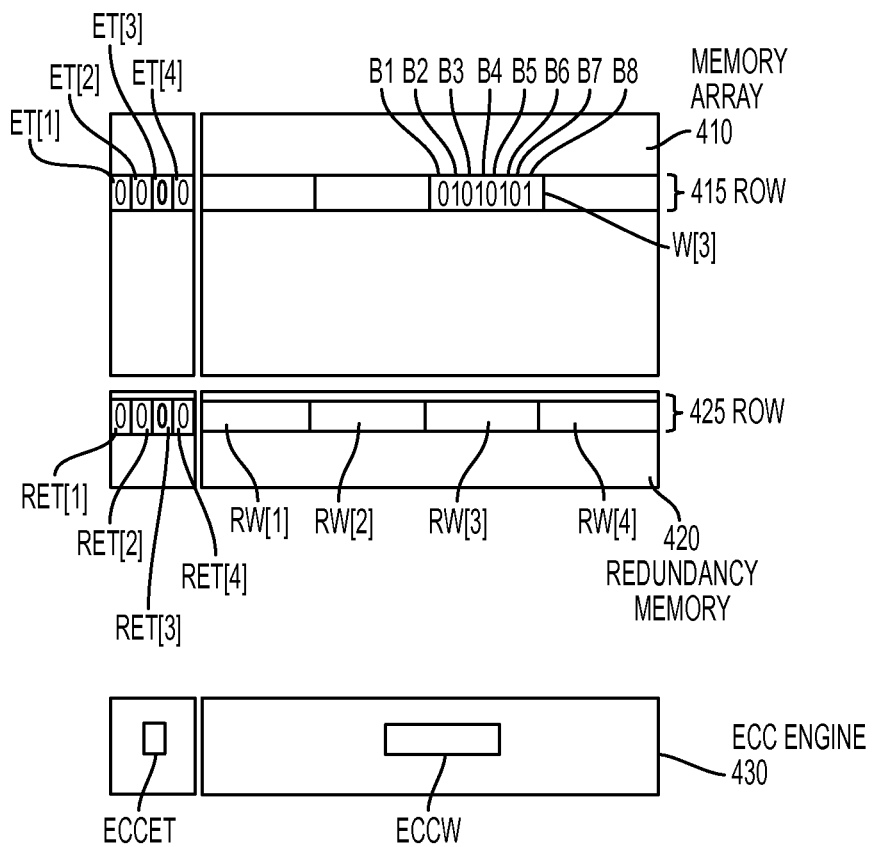
FIGS. 4-12 are diagrams illustrating various steps in repairing a memory failure, in accordance with some embodiments.

In FIG. 4, for illustration, a memory cell in word W[3] of row 415 is accessed. Word W[3] has an exemplary binary value of 01010101 corresponding to bits B1, B2, B3, B4, B5, B6, B7, and B8, respectively. In some embodiments, the binary value 01010101 of word W[3] has been written by ECC engine 120-1-3. Each of error-tag bits ET[1], ET[2], ET[3], and ET[4] has a low logical value, indicating that there is no error in the corresponding words W[1], W[2], W[3], and W[4].

Each of bits RET[1], RET[2], RET[3], and RET[4] has a low logical value, indicating that there is no error in the corresponding words RW[1], RW[2], RW[3], and RW[4]. For simplicity, data in words RW[1] to RW[4] are not shown until redundancy is invoked.

Figure 5:
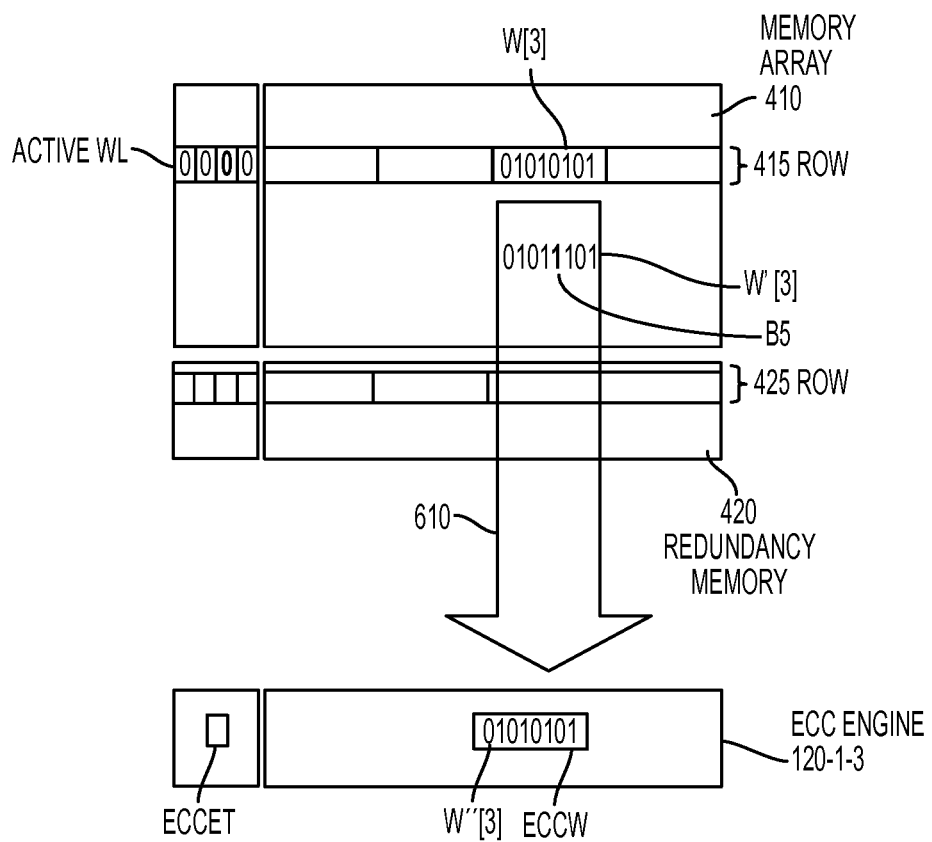

In FIG. 5, a word line WL corresponding to row 415 is activated for row 415 to be accessed. For illustration, when bit B5 of word W[3] of row 415 is accessed, bit B5 has an erroneous high logical value. As illustratively shown in FIG. 5, word W' [3] having a binary value of 01011101 indicates the erroneous bit B5. Arrow 610 illustrates that engine ECCW has identified the erroneous bit B5, and flipped the erroneous bit B5 to result in word W" [3] having the binary value 01010101 that is the corrected value of word W[3].

Figure 6:
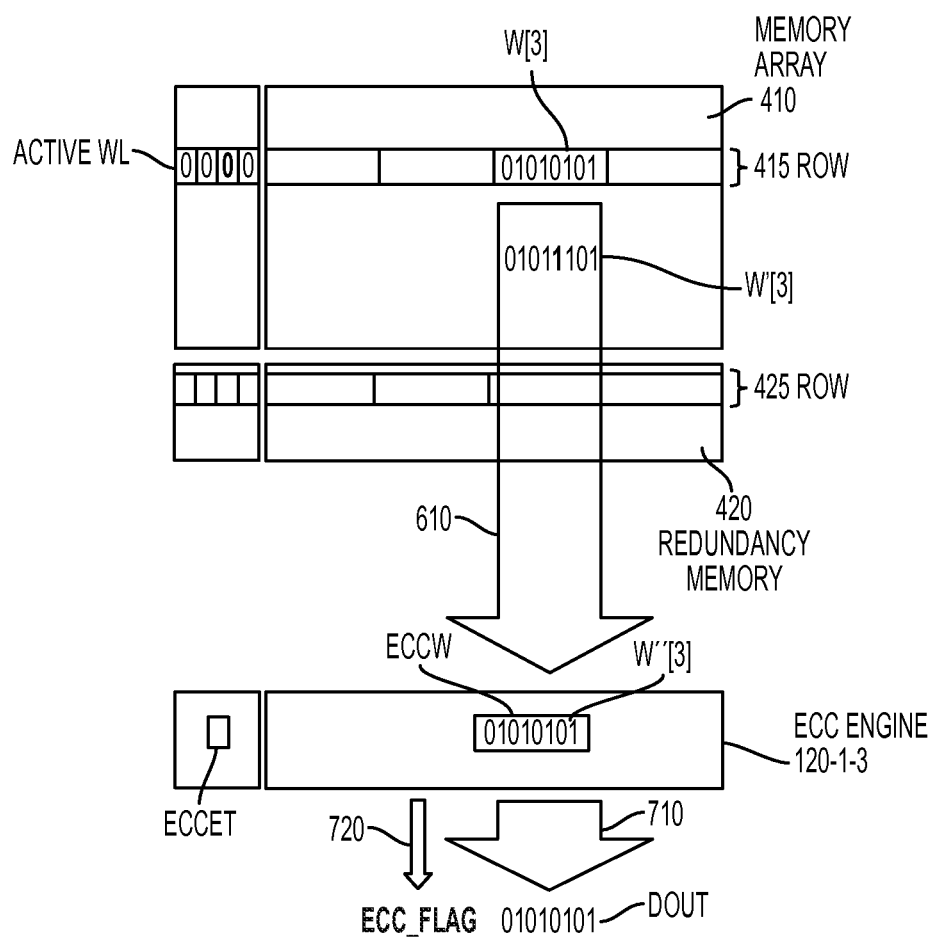

In FIG. 6, arrow 710 indicates that ECC engine 120-1-3 outputs the binary data 01010101 labeled as word DOUT to circuits (not shown) outside of eDRAM 120-1-1. The binary value 01010101 of word DOUT is the data in word W" [3] that represents the corrected data of word W[3]. Arrow 720 indicates that ECC engine 120-1-3 generates a signal ECC_FLAG having a high logical value. In some embodiments, signal ECC_FLAG is output through pin PECC_FLAG in FIG. 2. Signal ECC_FLAG having a logical high value indicates that an error in a word W has been identified by ECC engine 120-1-3. In the above illustration, an error in word W[3] has been identified by ECC engine 120-1-3.

Figure 7:
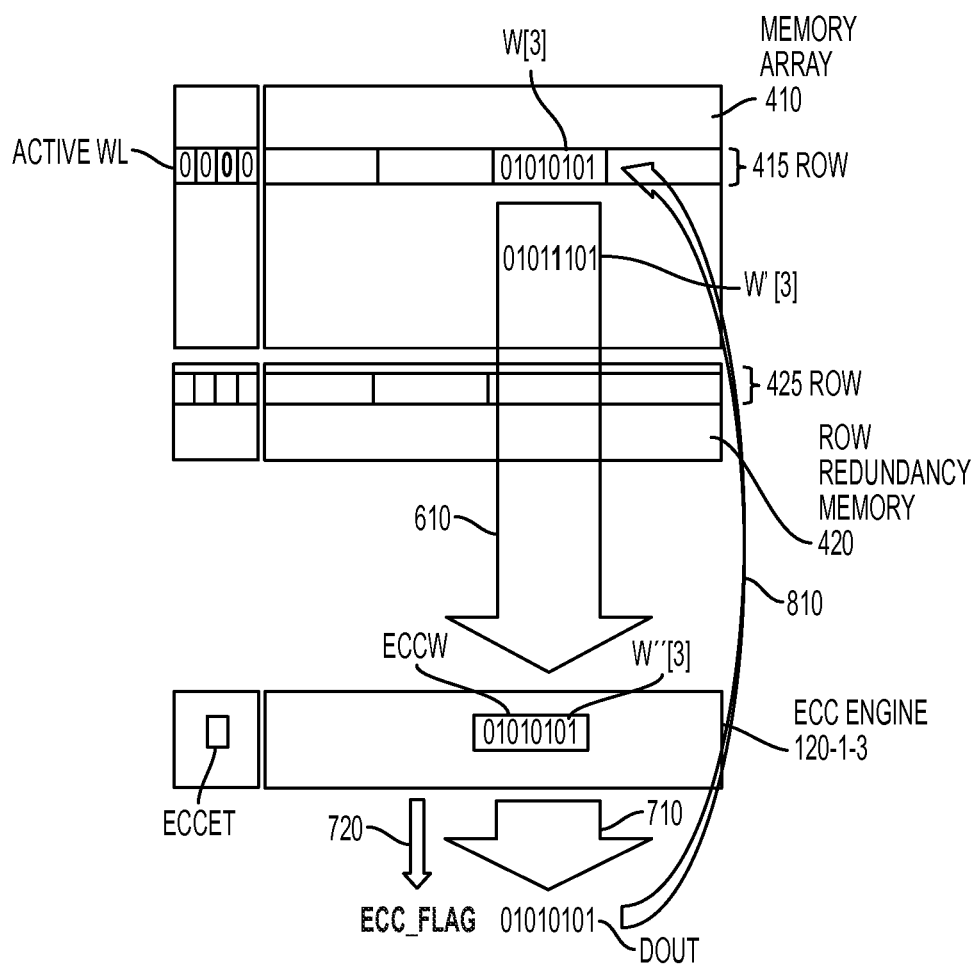

In FIG. 7, arrow 810 indicates that word DOUT having a binary value 01010101 is written back to word W[3] of row 415. Word DOUT includes the corrected value of word W[3]. In various embodiments, if the error is a soft error, the system using eDRAM 120-1-1 corrects the erroneous bit B5 in word W[3] itself. For example, in some embodiments, the system causes the correct binary data value 01010101 to be written to word W[3]. In some other embodiments, the system overwrites the data in word W[3] with the data used by an application that accesses word W[3]. Effectively, writing the data used by an application to word W[3] corrects the erroneous bit B5 in word W[3]. By nature of a soft error, the soft error disappears, and, statistically, will not occur again in the same memory location represented by bit B5 in word W[3]. Also statistically, another soft error will not likely occur in any bit of word W[3]. In contrast, if the error is a hard error, the error will occur again. For example, if the error is a stuck-high error, writing a low logical value results in a logical high value of bit B5 in word W[3].

Figure 8:
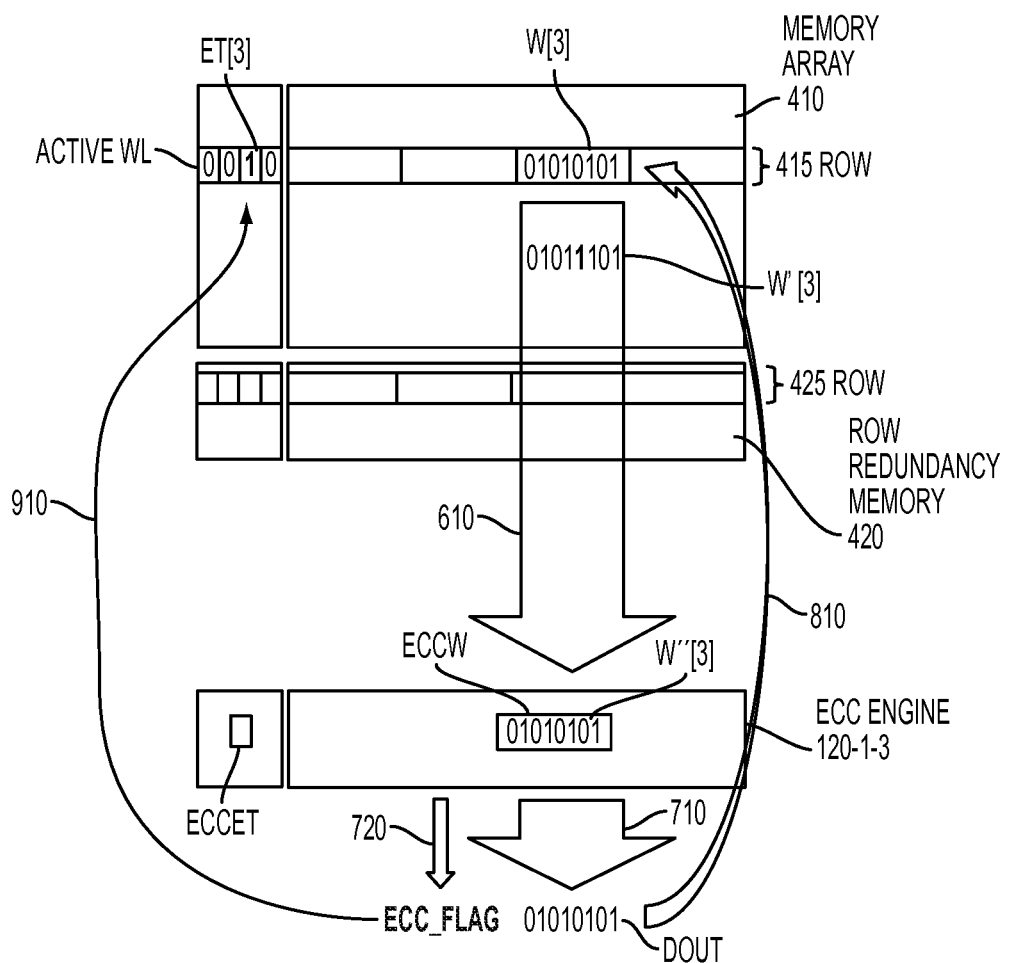

In FIG. 8, arrow 910 indicates that ECC engine 120-1-3 in response to the signal ECC_FLAG having a high logical value, writes bit ET[3] corresponding to word W[3] with a high logical value. A high logical value in bit ET[3] indicates that an error has occurred in any one bit of word W[3]. Further, if an error occurs again in word W[3], the high logical value in bit ET[3] together with the recurrence of the error indicates that the error is a hard error.

Exemplary Occurrence of a Hard Error

Figure 9:
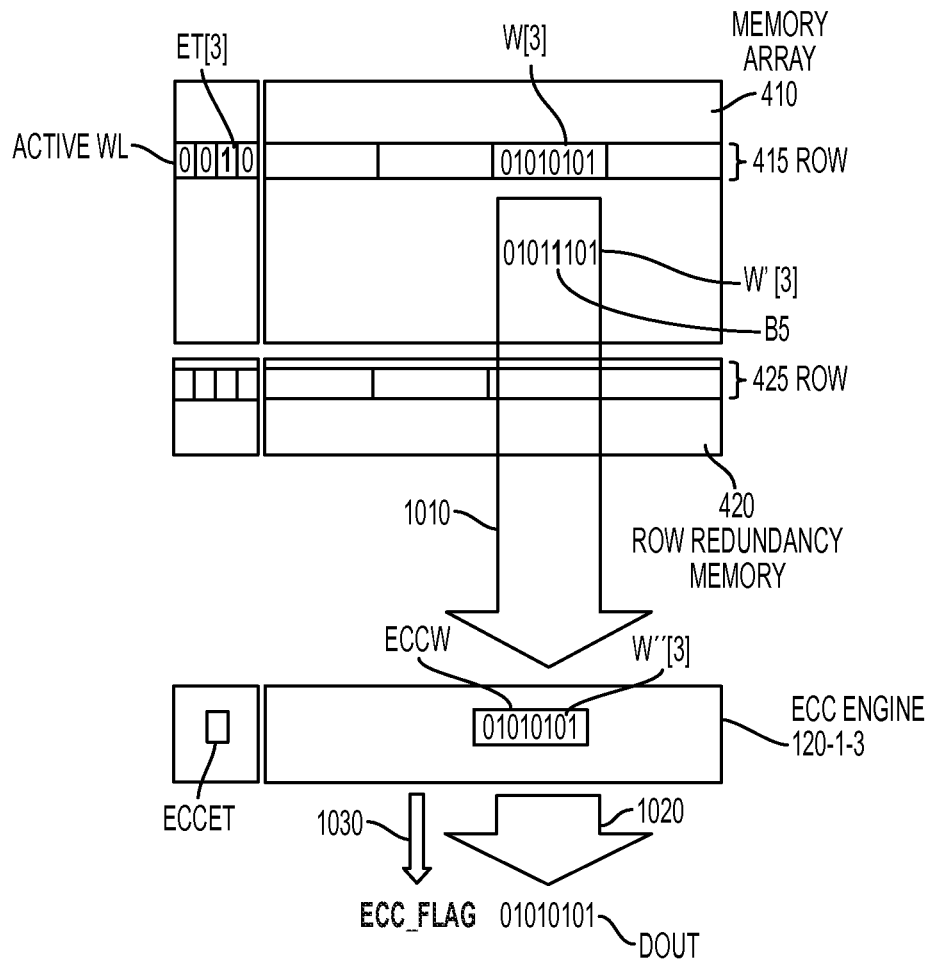
Figure 10:
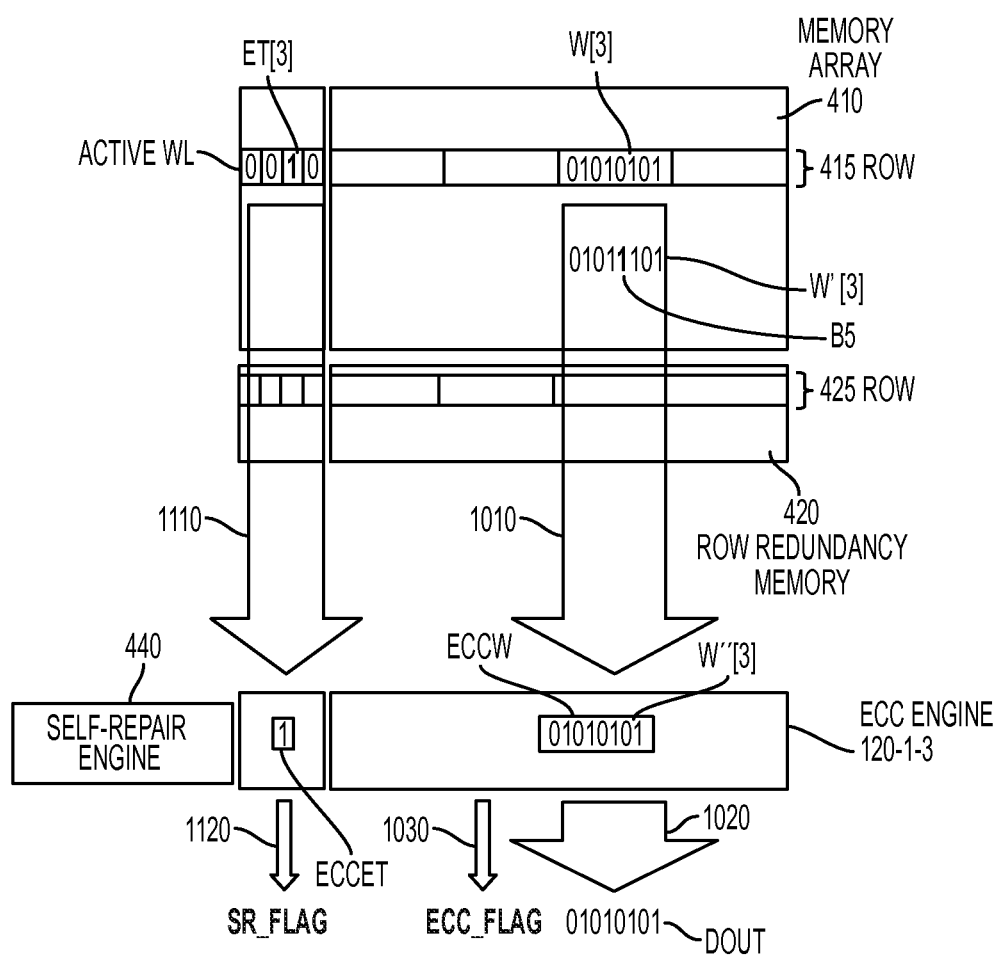

FIGS. 9 and 10 are diagrams illustrating an occurrence of a hard error, in accordance with some embodiments.

With reference to FIG. 9, for illustration, bit B5 of word W[3] of row 415 is accessed again, and an error occurs again in bit B5. Based on the high logical value in bit ET[3] indicating that bit B5 had an error in a previous access, and the fact that bit B5 has an error in the current access (the current error), ECC engine 120-1-3 recognizes the current error is a hard error. In some embodiments, when the error is a hard error, ECC engine 102-1-3 marks the address of bit B5 that has the error. ECC engine 102-1-3 also flags the address of bit B5 to be repaired. In some embodiments, the whole row 415 that contains the error bit B5 is repaired. Failed address engine 120-2-2 captures the corrected data 01010101 of word W[3] and the address of word W[3] having the erroneous bit B5. Failed address engine 120-2-2 also queues a self-repair. In some embodiments, the order for self-repairing erroneous locations is based on the order the item is entered onto the queue. In other words, an erroneous bit entering the queue first is repaired first.

In FIG. 9, arrow 1010 indicates that ECC engine 120-1-3 recognizes that bit B5 of word W[3] is erroneous, which is reflected in word W'[3] having a binary value 01011101. ECC engine 120-1-3 then flips the binary value of word W'[3] to result in the corrected data 01010101 labeled as word W"[3] in engine ECCW. Arrow 1020 indicates that ECC engine 120-1-3 outputs the data 01010101 as word DOUT to circuits (not shown) outside of eDRAM 120-1-1. Arrow 1030 indicates that ECC engine 120-1-3 generates a signal ECC_FLAG having a high logical value, indicating an error occurs and is identified by ECC engine 120-1-3.

In FIG. 10, arrow 1110 indicates that engine ECCET compares the high logical value of bit ET[3] and provides a high logical value in engine ECCET. ECC engine 120-1-3 recognizes that the error is a hard error based on the logical high value in engine ECCET and signal ECC_FLAG having a high logical value. As a result, ECC engine 120-1-3 issues a signal SR_FLAG having a high logical value, as shown by arrow 1120. Self-repair engine 440, based on signal SR_FLAG, captures the address of row 415 having a faulty location B5 in word W[3]. In some embodiments, signal SR_FLAG having a high logical value indicates that an error is to be repaired. In some embodiments, repairing is done when a NOP instruction is available. For example, a task application executed by the system using eDRAM 120-1-1 has various NOP instructions during execution of the application. Repairing is then invoked in the first NOP instruction after signal SR_FLAG has a high logical value. In some other embodiments, the NOP instruction for repairing is scheduled by the system using eDRAM 120-1-1. In such a situation, eDRAM 120-1-1 caches the address to be repaired and the corrected data. The repair will occur in the next NOP instruction received by eDRAM 120-1. For simplicity, the cached or delayed write mechanism is not shown in the drawings.

Exemplary Self-Repairing a Hard Error

Figure 11:
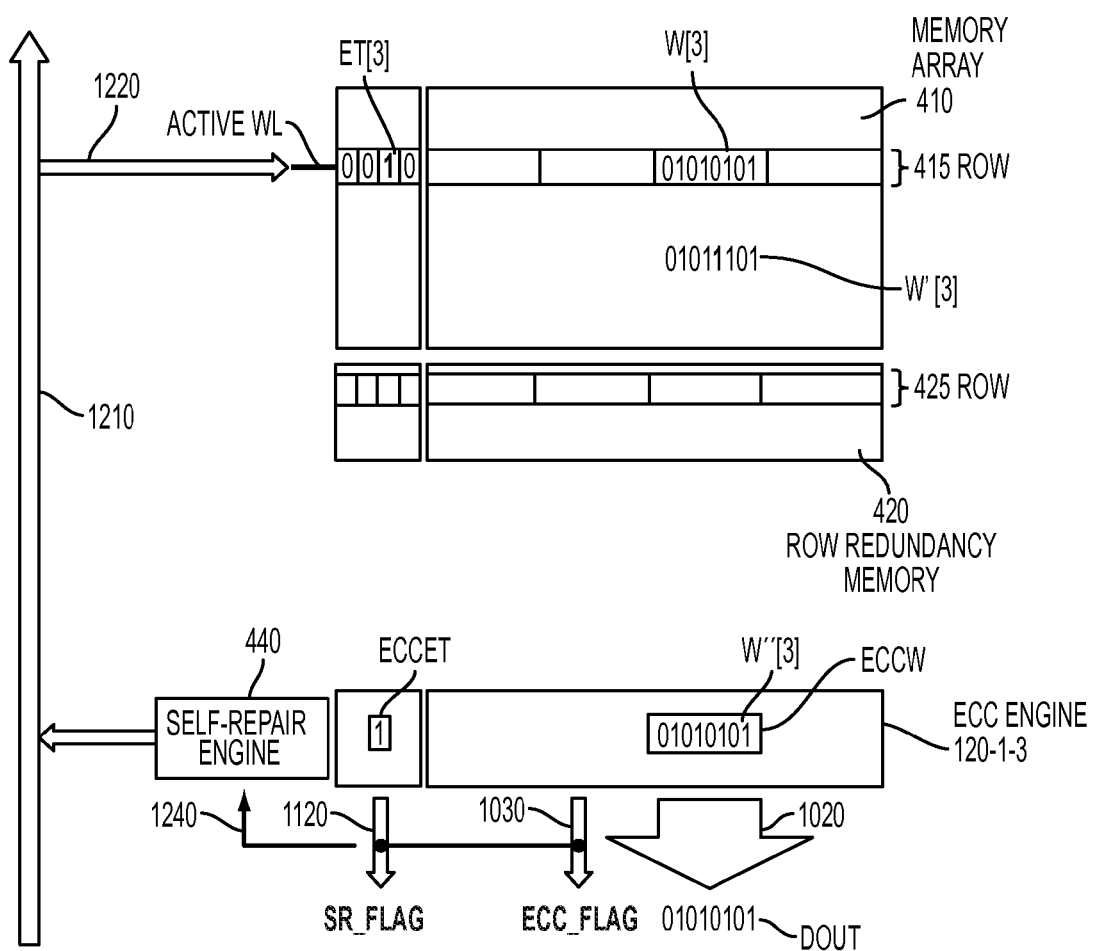
Figure 12:
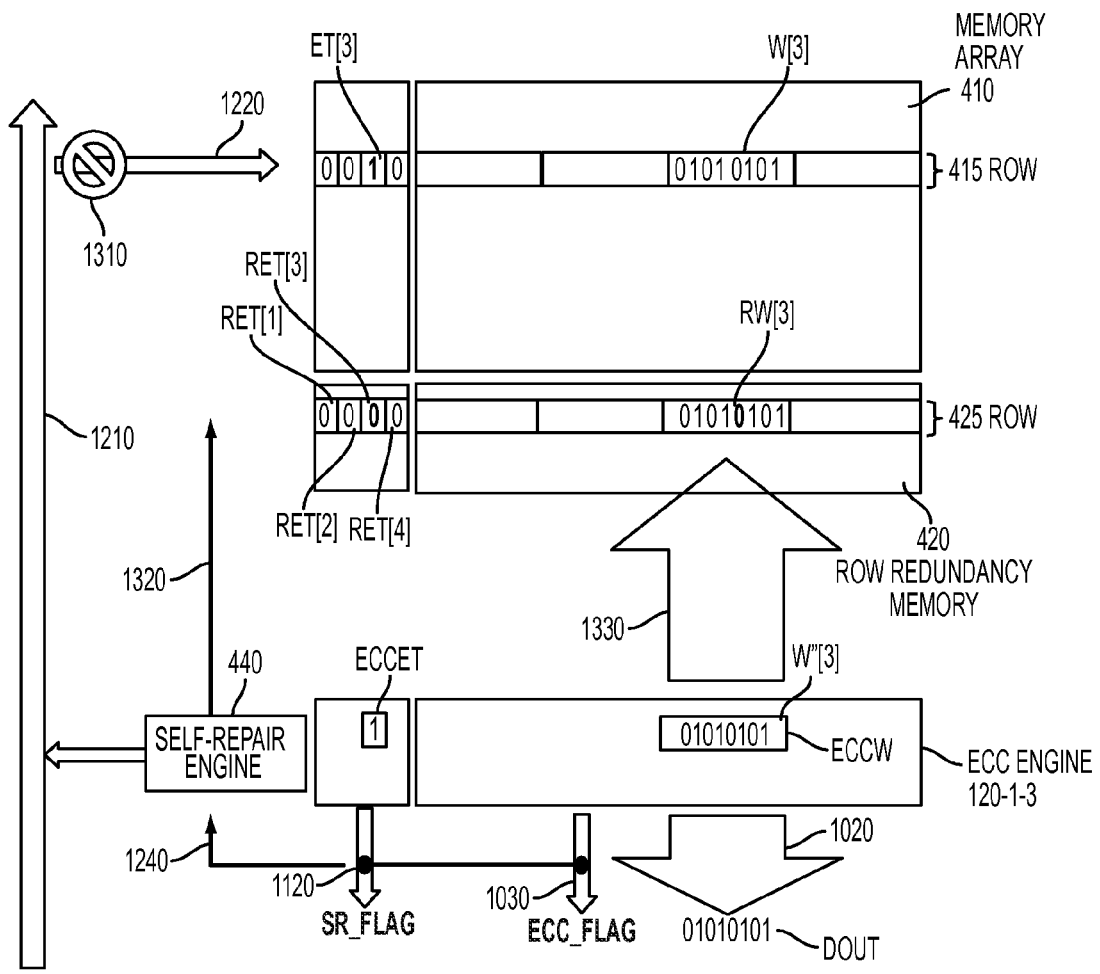

FIGS. 11-12 are diagrams used to illustrate self-repair of a hard error, in accordance with some embodiments.

In FIG. 11, various block diagrams involved in self-repairing a hard error are shown. For example, bit ET[3] has a logical high value indicating an error occurred previously in word W[3] of row 415. Engine ECCET includes a true result or a high logical value indicating that a hard error occurred in word W[3]. Word W"[3] in engine ECCW has the corrected value 01010101 of word W[3]. Word DOUT outputted by ECC engine 120-1-3 also includes the corrected value 01010101 of word W[3]. ECC engine 120-1-3 issues the signal ECC_FLAG having a high logical value based on the error occurred in bit B5 of word W[3]. ECC engine 120-1-3 also issues signal SR_FLAG based on signal ECC_FLAG and the high logical value in engine ECCET.

Arrow 1210 and arrow 1220 indicate self-repair engine 440 captures the row address and column address of word W[3] of row 415 that has a hard error. Arrow 1240 indicates that self-repair engine 440, based on signals ECC_FLAG and SR_FLAG, captures the failed address of row 415 having erroneous bit B5 of word W[3]. In some embodiments, self-repair engine 440 adds the address row 415 of word W[3] of bit B5 to a self-repair queue (not shown). Self-repair engine 440 also stores the address of row 415 in a comparator in self-repair engine 440.

In FIG. 12, sign 1310 indicates that no access to word W[3] on row 415 is allowed. Arrow 1320 indicates that self-repair engine 440 redirects an access to word W[3] on row 415 to RW[3] on row 425 in redundancy memory 420.

Arrow 1330 indicates that self-repair engine 440 copies the corrected value 01010101 of word W"[3] in engine ECCW to word RW[3]. Based on the stored failed address in self-repair engine 440, when a bit in word W[3] of row 415 is accessed again, self-repair engine 440 redirects the access to the corresponding bit of word RW[3] in row 425.

Each of bits RET[1], RET[2], RET[3], and RET[4] is shown having a low logical value, indicating that corresponding words RW[1], RW[2], R[3], and RW[4] of row 425 do not have an error.

The above explanation illustrates self-repairing an error in word W[3] of row 415. Self-repairing an error in another word of row 415 is similar and should be recognizable by persons of ordinary skill in the art in view of this disclosure. Self-repairing is also explained in the context that row 415 of memory array 410 is redirected to row 425 in redundancy memory 420 when a hard error occurs. Self-repairing an error in another row of memory array 410 by using the same row 425 or another row in redundancy memory 420 is similar and should be recognizable by persons of ordinary skill in the art in view of this disclosure.

In some embodiments, if a location in a word of a row of redundancy memory 420 has an error, the process of self-repairing the error in a row of redundancy memory 420 is similar to that of self-repairing the row 415 in memory array 410 and should be recognizable by persons of ordinary skill in the art in view of this disclosure.

Various embodiments are advantageous because repairing the erroneous word uses a self-repair mechanism. For example, the self-repair signal SR_FLAG is logically high to indicate an error needs to be repaired. As soon as the command CMD receives a NOP instruction, eDRAM 120-1-1, at the rising edge of the clock signal CLK, invokes the self-repair mechanism to repair the error. Effectively, a semiconductor device using eDRAM 120-1-1 identifies and repairs the error without intervention by a system designer. NOP instructions are commonly available in an application using eDRAM 120-1-1.

In some embodiments, a memory structure includes a memory array, a plurality of first bits, a plurality of redundancy rows, and a plurality of second bits. The memory array has a plurality of rows, and each row of the plurality of rows of the memory array includes a plurality of memory words. Each first bit of the plurality of first bits is associated with a memory word of the plurality of memory words. A logic state of the each first bit indicates whether the memory word associated with the each first bit has had a failed bit. Each redundancy row of the plurality of redundancy rows includes a plurality of redundancy words, and each redundancy word of the plurality of redundancy words is associated with a corresponding memory word of the plurality of memory words. Each second bit of the plurality of second bits is associated with a redundancy word of the plurality of redundancy words. A logic state of the each second bit indicates whether the redundancy word associated with the each second bit has had a failed bit.

In some embodiments, a memory structure includes a memory row of a memory array, a plurality of first bits, a first redundancy row, and a plurality of second bits. The memory row includes a plurality of memory words. The plurality of first bits is configured to indicate whether an individual memory word of the plurality of memory words of the memory row has an error. The first redundancy row includes a plurality of first redundancy words. The plurality of second bits is configured to indicate whether an individual first redundancy word of the plurality of first redundancy words of the first redundancy row has an error.

In some embodiments, a method includes accessing data stored in a memory word and determining, by an error correction engine, if the data contains an error. In response to a determination that the data contains the error, a tag value associated with the memory word is updated to indicate that the memory word has at least one failed bit when the tag value indicates that the memory word has no failed bit, and an error-fixing flag is generated when the tag value indicates that the memory word has at least one failed bit.

A number of embodiments have been described. It will nevertheless be understood that various modifications may be made without departing from the spirit and scope of the disclosure.

The above method with reference to FIGS. 4 to 12 includes exemplary steps, but the steps are not necessarily performed in the order shown. Steps may be added, replaced, changed order, and/or eliminated as appropriate, in accordance with the spirit and scope of disclosed embodiments.

What is claimed is:

1. A memory structure comprising:
a memory array having a plurality of rows, each row of the plurality of rows of the memory array including a plurality of memory words;
a plurality of first bits, each first bit of the plurality of first bits being associated with a memory word of the plurality of memory words, wherein a logic state of the each first bit indicates whether the memory word associated with the each first bit has had a failed bit;
a plurality of redundancy rows, each redundancy row of the plurality of redundancy rows including a plurality of redundancy words, each redundancy word of the plurality of redundancy words being associated with a corresponding memory word of the plurality of memory words; and
a plurality of second bits, each second bit of the plurality of second bits being associated with a redundancy word of the plurality of redundancy words, wherein a logic state of the each second bit indicates whether the redundancy word associated with the each second bit has had a failed bit.

2. The memory structure of claim 1, further comprising:
a word logic engine configured to process each memory word of the plurality of memory words of a row of the memory array; and
a bit-tag logic engine configured to process the each first bit associated with the each memory word of the plurality of memory words to be processed.

3. The memory structure of claim 1, wherein the memory structure is configured to satisfy at least one of the following conditions:
the each first bit is associated with the memory word based on a first index of the each first bit and a second index of the memory word associated with the each first bit; or
the each second bit is associated with the redundancy word based on a third index of the each second bit and a fourth index of the redundancy word associated with the each second bit.

4. The memory structure of claim 1, further comprising an error correction engine configured
to maintain a state of the each first bit when accessing the memory word associated with the each first bit does not result in an error; and/or
to maintain a state of the each second bit when accessing the redundancy word associated with the each second bit does not result in an error.

5. The memory structure of claim 1, further comprising an error correct engine configured
to cause a change in the state of the each first bit based on an error in the memory word associated with the each first bit; and/or
to cause a change in the state of the each second bit based on an error in the redundancy word associated with the each second bit.

6. The memory structure of claim 1, wherein
a first redundancy row of the plurality of redundancy of rows is configured to be used in place of a row of the memory array or in place of a second redundancy row.

7. The memory structure of claim 1, wherein
a first redundancy word of the plurality of redundancy rows is configured to be used in place of a word of the memory array or in place of a second word of the plurality of redundancy rows.

8. A memory structure comprising:
a memory row of a memory array, the memory row including a plurality of memory words;
a plurality of first bits configured to indicate whether an individual memory word of the plurality of memory words of the memory row has an error;
a first redundancy row of the memory array, the first redundancy row including a plurality of first redundancy words; and
a plurality of second bits configured to indicate whether an individual first redundancy word of the plurality of first redundancy words of the first redundancy row has an error.

9. The memory structure of claim 8, wherein
the first redundancy row is configured to be used in place of the memory row; or
a redundancy word of the first redundancy row is configured to be used in place of a word of the memory row.

10. The memory structure of claim 8, further comprising:
a second redundancy row, the second redundancy row including a plurality of second redundancy words; and
a plurality of third bits configured to indicate whether an individual second redundancy word of the plurality of second redundancy words of the first redundancy row has an error.

11. The memory structure of claim 10, wherein
the second redundancy row is configured to be used in place of the first redundancy row; or
a word of the second redundancy row is configured to be used in place of a word of the first redundancy row.

12. The memory structure of claim 8, further comprising:
an error correction engine configured to generate an error-repair flag based on one or more bits of the plurality of first bits and an error of the memory word; and
a repair engine configured to repair the memory word having the error based on the error-repair flag.

13. The memory structure of claim 12, wherein the repair engine is configured to repair the memory word having the error further based on a NOP instruction of a system using the memory structure.

14. The memory structure of claim 8, wherein the memory structure is configured to satisfy at least one of the following conditions:
a state of the each first bit of the plurality of first bits indicating whether a corresponding word of the plurality of memory words has an error; or
a state of the each second bit of the plurality of second bits indicating whether a corresponding word of the plurality of first redundancy words has an error.

15. The memory structure of claim 8, wherein the memory structure is configured to satisfy at least one of the following conditions:
the plurality of first bits is associated with the plurality of memory words based on a first binary combination of the plurality of first bits; or
the plurality of second bits is associated with the plurality of first redundancy word based on a second binary combination of the plurality of second bits.

16. A method comprising:
accessing data stored in a memory word;
determining, by an error correction engine, if the data contains an error; and
in response to a determination that the data contains the error:
updating a tag logic value associated with the memory word to indicate that the memory word has at least one failed bit; and
generating an error-fixing flag when the tag logic value indicates that the memory word has at least one failed bit.

17. The method of claim 16, further comprising, in response to the generation of the error-fixing flag, assigning a redundancy word to be used in place of the memory word.

18. The method of claim 17, wherein assigning the redundancy word is performed during a no-operation (NOP) instruction cycle.

19. The method of claim 17, further comprising:
setting a tag logic value associated with the redundancy word to indicate that the redundancy word has no failed bit.

20. The method of claim 17, further comprising redirecting another access of the memory word to the redundancy word.

* * * * *